(12) United States Patent
Kaguchi et al.

(10) Patent No.: US 9,627,571 B2
(45) Date of Patent: Apr. 18, 2017

(54) SEMICONDUCTOR DEVICE

(71) Applicant: Mitsubishi Electric Corporation, Tokyo (JP)

(72) Inventors: Naoto Kaguchi, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/223,149

(22) Filed: Mar. 24, 2014

(65) Prior Publication Data
US 2015/0014705 A1    Jan. 15, 2015

(30) Foreign Application Priority Data

Jul. 9, 2013   (JP) .................................. 2013-143562

(51) Int. Cl.
*H01L 31/16*   (2006.01)
*H01L 31/167*  (2006.01)
*G01K 7/01*    (2006.01)

(52) U.S. Cl.
CPC .............. *H01L 31/167* (2013.01); *G01K 7/01* (2013.01); *G01K 2217/00* (2013.01);
(Continued)

(58) Field of Classification Search
CPC ........ B82Y 30/00; G01N 21/77; G01N 31/22; G01N 33/497; Y10T 436/15;
(Continued)

(56) References Cited

U.S. PATENT DOCUMENTS 6,057,678 A * 5/2000 Tagiri ........................ G01D 5/34
                                                        250/227.14
6,180,966 B1   1/2001 Kohno et al.
(Continued)

FOREIGN PATENT DOCUMENTS

CN         102684694 A         9/2012
GB    WO 2013164588 A1 *  11/2013  ........... H01L 25/167
(Continued)

OTHER PUBLICATIONS

An Office Action issued by the German Patent Office on Oct. 28, 2015, which corresponds to German Patent Application No. 10 2014 211 905.7 and is related to U.S. Appl. No. 14/223,149; with English language translation.

(Continued)

*Primary Examiner* — Chuong A Luu
*Assistant Examiner* — Rodolfo D Fortich
(74) *Attorney, Agent, or Firm* — Studebaker & Brackett PC

(57) ABSTRACT

An optical fiber is provided between a photodiode and a semiconductor active portion of a wide gap semiconductor element forming portion such that emitted light at the time of light emission of the semiconductor active portion of the wide gap semiconductor element forming portion is incident from an incident surface of the optical fiber, and is received from an emitting surface to the photodiode through the optical fiber. Specifically, the incident surface of the optical fiber is arranged so as to be opposed to a side surface portion of the wide gap semiconductor element forming portion, so that the emitted light at the time of light emission of the wide gap semiconductor element is incident on the incident surface.

5 Claims, 5 Drawing Sheets

(52) U.S. Cl.
CPC ............... *H01L 2224/48091* (2013.01); *H01L 2224/73265* (2013.01); *H01L 2924/12032* (2013.01); *H01L 2924/13055* (2013.01)

(58) Field of Classification Search
CPC ............. H01L 31/167; H01L 31/02019; H01L 31/036; H01L 31/1013; H01L 31/02002; H01L 31/0232; H01L 31/02325; H01L 31/164
USPC .................. 257/77, 76, 13, 707, E21.01, 80
See application file for complete search history.

(56) References Cited

U.S. PATENT DOCUMENTS

| | | |
|---|---|---|
| 7,851,866 B2 | 12/2010 | Sakurai et al. |
| 2003/0227950 A1 | 12/2003 | Oomori |
| 2006/0215341 A1 | 9/2006 | Sakurai et al. |
| 2007/0047220 A1 | 3/2007 | Kang et al. |
| 2008/0042142 A1 | 2/2008 | Sugawara et al. |
| 2009/0141754 A1 | 6/2009 | Teramura |
| 2011/0297934 A1 | 12/2011 | Soeno |
| 2012/0141327 A1* | 6/2012 | Huh .................... G01N 21/7703 422/69 |
| 2012/0170023 A1* | 7/2012 | Szobota et al. ................. 356/51 |
| 2012/0235756 A1* | 9/2012 | Nishida ..................... H03L 7/26 331/94.1 |
| 2013/0257517 A1 | 10/2013 | Kawashima |

FOREIGN PATENT DOCUMENTS

| | | |
|---|---|---|
| JP | S63-285430 A | 11/1988 |
| JP | 2000-183823 A | 6/2000 |
| JP | 2002-325427 A | 11/2002 |
| JP | 2005-115040 A | 4/2005 |
| JP | 2005-151779 A | 6/2005 |
| JP | 2006-271098 A | 10/2006 |
| JP | 2007-066891 A | 3/2007 |
| JP | 2007-103823 A | 4/2007 |
| JP | 2009-042302 A | 2/2009 |
| JP | 2010-192565 A | 9/2010 |
| WO | 2013/005520 A1 | 1/2013 |

OTHER PUBLICATIONS

An Office Action issued by the Korean Patent Office on Aug. 21, 2015, which corresponds to Korean Patent Application No. 10-2014-0074048 and is related to U.S. Appl. No. 14/223,149; with English language translation.

An Office Action issued by the Chinese Patent Office on Nov. 1, 2016, which corresponds to Chinese Patent Application No. 201410325571.2 and is related to U.S. Appl. No. 14/223,149; with English language partial translation.

An Office Action; "Notification of Reason for Refusal" issued by the Japanese Patent Office on Nov. 8, 2016, which corresponds to Japanese Patent Application No. 2013-143562 and is related to U.S. Appl. No. 14/223,149; with English language partial translation.

* cited by examiner

F I G . 3
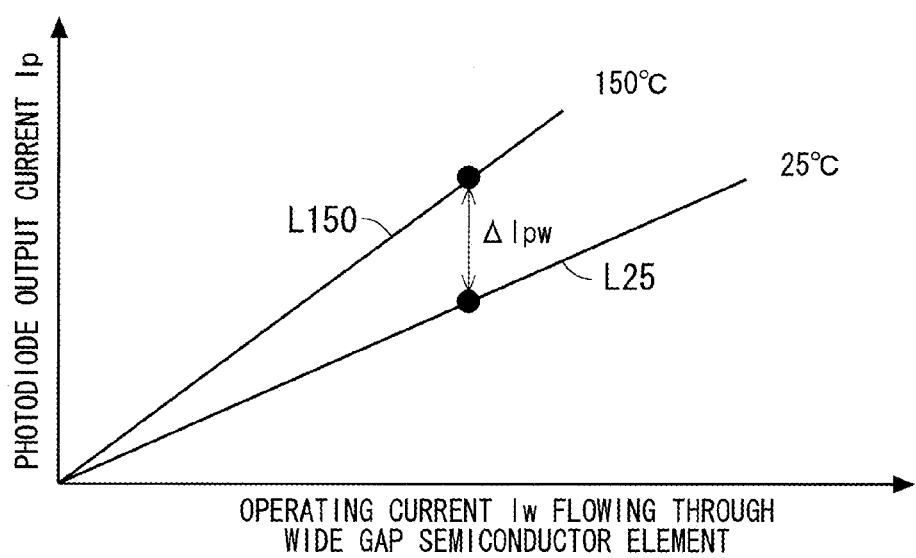

F I G . 4
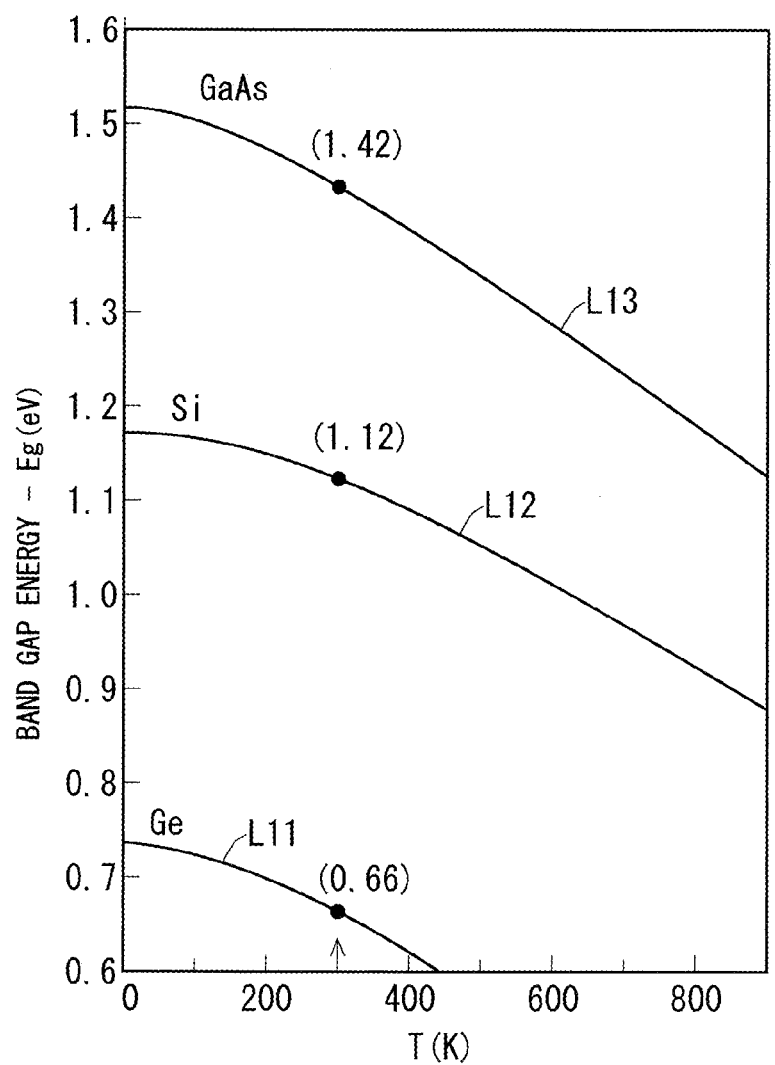

LIGHT RECEIVING SENSITIVITY ACCORDING TO PHOTODIODE MATERIAL

SEMICONDUCTOR DEVICE

BACKGROUND OF THE INVENTION

Field of the Invention

The present invention relates to a semiconductor device which has a wide gap semiconductor element and which is capable of detecting a temperature of the wide gap semiconductor element.

Description of the Background Art

Conventionally, for measuring an operating temperature of a power semiconductor element, there has been generally used a semiconductor device having a power semiconductor element. The semiconductor device has a temperature detecting element such as a polysilicon diode formed therein electrically independently from the power semiconductor element to detect temperature of the power semiconductor element by temperature characteristics of the temperature detecting element. As a semiconductor device of this type, there is, for example, a current conversion device disclosed in Japanese Patent Application Laid-Open No. 2006-271098.

In a conventional semiconductor device which has a temperature detecting function of a power semiconductor element and is integrated into one chip, as described above, a temperature detecting element is formed inside the semiconductor device together with a power semiconductor element to detect an operating temperature of the power semiconductor element by using temperature characteristics of the temperature detecting element. Consequently, there have been disadvantages in forming a pad portion for transmitting and receiving a signal between the temperature detecting element and the outside. This configuration increases a device (chip) area to lead to cost increase, and requires an excessive wire bonding process in the pad portion to impose a greater constraint on assembling of the semiconductor device.

In addition, in a case of a wide gap semiconductor element in which a power semiconductor element is formed of a wide gap semiconductor material having light-emitting property, there has been a problem in that when the wide gap semiconductor element is operated at a high temperature of 200° C. or higher intended during the operation thereof, the conventionally used temperature detecting element such as a photodiode does not operate and is unusable.

SUMMARY OF THE INVENTION

An object of the present invention is to obtain a semiconductor device in which a temperature detecting function of a wide gap semiconductor element is operated normally, and to achieve cost reduction and improvement in assemblability.

The semiconductor device according to the present invention includes a semiconductor element, a current detecting portion, an optical fiber, and a photodiode. The semiconductor device is formed of a wide gap semiconductor material having light-emitting property to emit light during operation. The current detecting portion detects a current flowing during operation of the semiconductor element as an operating current. Emitted light during operation of the semiconductor element is incident on the optical fiber. The photodiode receives the emitted light obtained by propagation through the optical fiber.

According to the semiconductor device of the present invention, the photodiode generates an output current corresponding to a light emission intensity of the emitted light received through the optical fiber. The output current of the photodiode is determined by a light emission intensity of the emitted light and a current (operating current) flowing during operation of the semiconductor element. The light emission intensity has a dependence on wavelength of the emitted light, and the wavelength thereof has a dependence on temperature of the semiconductor element at the time of light emission.

Accordingly, the output current of the photodiode is determined by the temperature and the operating current of the semiconductor element during operation, and therefore, the temperature of the semiconductor element during operation can be obtained from the output current and the operating current. That is, the photodiode can be used as a temperature detecting portion.

In addition, the photodiode is provided in a form so as to receive the emitted light obtained by propagation through the optical fiber. With this configuration, therefore, the photodiode is not required to be provided integrally with the semiconductor element, so that a formation area of a semiconductor element forming portion forming the semiconductor element can be reduced to achieve cost reduction and improvement in assemblability.

In addition, in a case when a formation area of a wide gap semiconductor element forming portion is formed in the same size as the conventional technique, a greater effective area of the wide gap semiconductor element can be obtained as compared to that of the conventional technique, so that properties of the wide gap semiconductor element itself can be improved.

Further, the temperature detecting portion (photodiode) which is electrically weak is not required to be formed integrally with the semiconductor element, so that the reliability of the semiconductor device can be improved.

In addition, the optical fiber is interposed between the semiconductor element and the photodiode, so that a temperature in the vicinity of the photodiode can be lowered than a temperature in the vicinity of the semiconductor element. For example, even when the semiconductor element is in a high temperature state of 200° C. or higher, the optical fiber is interposed therebetween such that the temperature environment is set to be 150° C. or lower to allow the photodiode to be operated. With this configuration, the high temperature state of the semiconductor element of 200° C. or higher can also be detected by the output current flowing through the photodiode.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a graph showing relationships between an operating current Iw flowing through the wide gap semiconductor element and a photodiode output current Ip;

FIG. 4 is a graph showing relationships between a temperature (K) and band gap energy according to respective semiconductor materials;

DESCRIPTION OF THE PREFERRED EMBODIMENTS

<Underlying Technique>

Figure 8:
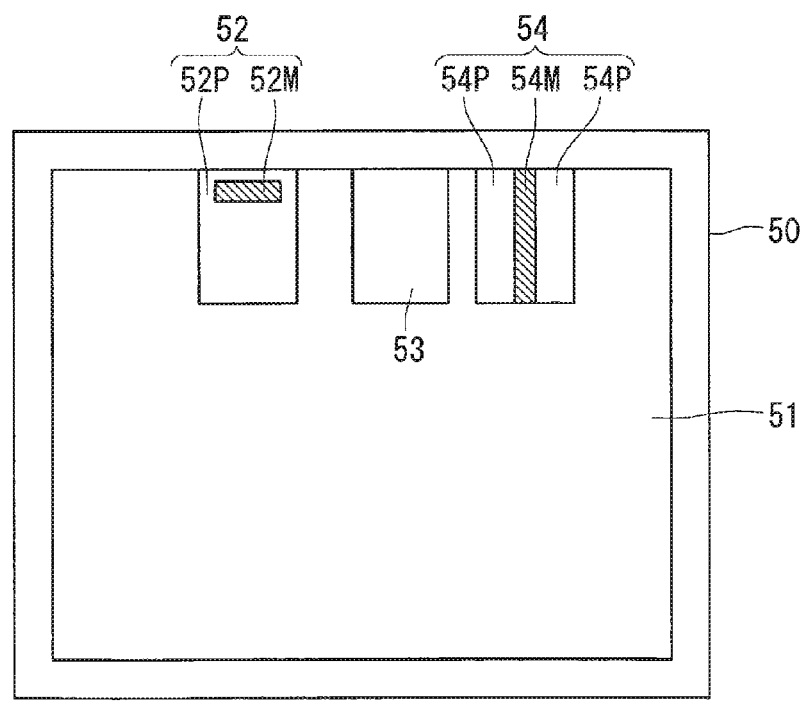
FIG. 8 is an explanatory view schematically showing a planar configuration of a conventional semiconductor device having a temperature detecting function.

FIG. 8 is an explanatory view schematically showing a planar configuration of a conventional semiconductor device having a temperature detecting function. As shown in FIG. 8, a surface electrode 51 of a main electrode (serving as a collector electrode) of an IGBT (Insulated Gate Bipolar Transistor) is formed in a majority of a region on a substrate 50, and a gate electrode 53 of the IGBT is formed in a part of the surface electrode 51. Then, a current sensing portion 52 (current sensing main portion 52M and pad portion 52P) is formed in a part other than the gate electrode 53, and a temperature sensing portion 54 (temperature sensing main portion 54M and pad portion 54P) is formed in a part other than the gate electrode 53 and the current sensing portion 52. Note that, a sensing IGBT (main electrode, i.e., collector electrode), for example, is formed in the current sensing main portion 52M, and a photodiode, for example, is formed in a temperature sensing main portion 54M.

As shown in FIG. 8, the temperature sensing portion 54 is provided together with the IGBT (surface electrode 51, gate electrode 53) on the substrate 50, which leads to an excessive increase in a circuit forming area of the semiconductor device. As a result, this configuration causes an increase in a chip area (element forming area capable of forming elements on the substrate 50) to lead to cost increase, and further, requires excessive processes, such as a wire bonding process, on the pad portion 54P with respect to the temperature sensing portion 54, to impose a greater constraint on assembling.

In addition, when the IGBT is formed of a wide gap semiconductor material having light-emitting property, a high temperature operation at 200° C. or higher is assumed during operation. Accordingly, there has been a problem in that the environment is changed to the temperature environment in which a conventionally used temperature detecting element such as a photodiode cannot be used, and consequently, the conventional temperature detecting element cannot be used for temperature detection of a wide gap semiconductor element. Hereinafter, descriptions will be made of preferred embodiments to solve these problems.

<First Preferred Embodiment>

Figure 1:
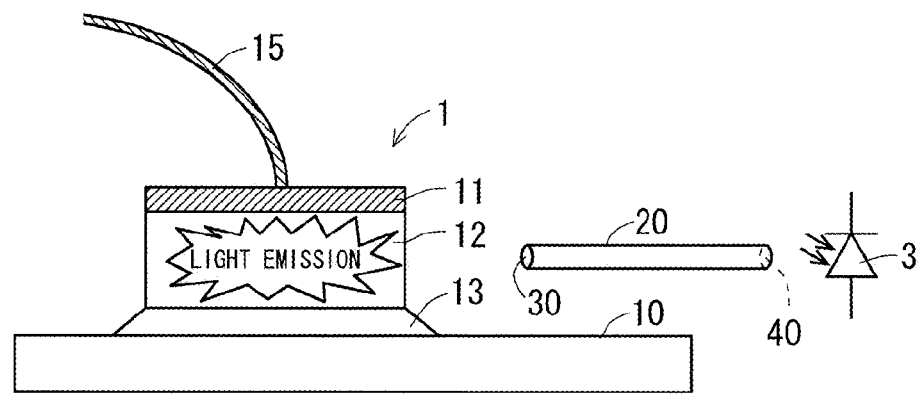
FIG. 1 is an explanatory view schematically showing a schematic configuration of a semiconductor device according to a first preferred embodiment of the present invention.

FIG. 1 is an explanatory view schematically showing a schematic cross-sectional configuration of a semiconductor device according to a first preferred embodiment of the present invention.

As shown in FIG. 1, a wide gap semiconductor element forming portion 1 is provided on a semiconductor substrate 10. The wide gap semiconductor element forming portion 1 is formed of a laminated structure of a base 13, a semiconductor active portion 12, and an electrode portion 11. From the electrode portion 11 serving as a main electrode portion, a signal can be transmitted to and received from the outside via a signal wire 15.

Figure 2:
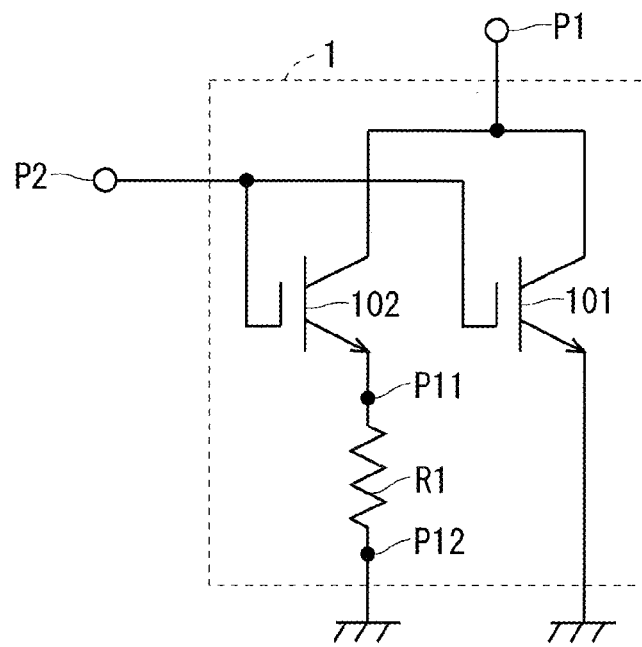
FIG. 2 is a circuit diagram showing an example of an internal configuration of a wide gap semiconductor element forming portion shown in FIG. 1.

FIG. 2 is a circuit diagram showing an example of an internal configuration of the wide gap semiconductor element forming portion 1. As shown in FIG. 2, the wide gap semiconductor element forming portion 1 includes therein an IGBT main body 101 formed of a wide gap semiconductor material having light-emitting property. Further, a current sensing IGBT 102 is provided in parallel with the IGBT main body 101, collectors of the IGBT main body 101 and the current sensing IGBT 102 are connected in common to an external terminal P1, and insulated gates are connected in common to an external terminal P2. An emitter of the IGBT main body 101 is grounded, and an emitter of the current sensing IGBT 102 is grounded via a resistor R1. Then, voltages at both ends P11, P12 of the resistor R1 are measured, so that a current flowing through the IGBT main body 101 can be calculated based on a size ratio between the IGBT main body 101 and the current sensing IGBT 102, and the like. In this manner, the IGBT main body 101 as a wide gap semiconductor element and the current sensing IGBT 102 as a current sensing portion are integrated into one chip to integrally form the wide gap semiconductor element forming portion 1.

The semiconductor active portion 12 of the wide gap semiconductor element forming portion 1 is formed by using the wide gap semiconductor material, and a carrier recombination center (area where there exist impurity atoms and a complex of a plurality of impurity atoms facilitating a process in which an electron and a hole are recombined with each other to disappear) is formed in any one of a n-type layer and a p-type layer which form a junction. With this configuration, it is possible to obtain a light emitting wide gap semiconductor element (IGBT main body 101) which emits light when a current flows through the junction. Hereinafter, the above-described light emitting operation by forming the recombination center may be simply referred to as "light emission by the bipolar operation". The semiconductor active portion 12 is formed in a pillar shape (cylindrical, prismatic, and the like), and emitted light is radiated from a side surface thereof at the time of light emission by the bipolar operation.

Referring back to FIG. 1, an optical fiber 20 is provided between the semiconductor active portion 12 of the wide gap semiconductor element forming portion 1 and the photodiode 3, such that the emitted light at the time of light emission of the semiconductor active portion 12 (during (bipolar) operation of the IGBT main body 101) is incident from an incident surface 30 of the optical fiber 20 to be received from an emitting surface 40 to the photodiode 3 through the optical fiber 20.

As described above, the optical fiber 20 is disposed such that the incident surface 30 is positioned in the vicinity of the side surface of the wide gap semiconductor element forming portion 1 (semiconductor active portion 12), to guide the emitted light at the time of light emission of the semiconductor active portion 12 to the photodiode 3. Then, the photodiode 3 generates an output current corresponding to a light emission intensity of the emitted light received through the optical fiber 20.

At this time, the optical fiber 20 is disposed in the side surface of the wide gap semiconductor element forming portion 1, so that the emitted light can be incident from the incident surface 30 of the optical fiber 20, without being affected by a wire bond, a solder joint, and the like mainly occurring at the electrode portion 11 at the time of module assembling.

Specifically, the incident surface 30 of the optical fiber 20 is arranged so as to be opposed to a side surface portion of the wide gap semiconductor element forming portion 1, so that the emitted light at the time of light emission of the wide gap semiconductor element can be incident from the incident surface 30 of the optical fiber 20, without being affected by light cut-off by a surface electrode of the wide gap semiconductor element, or wire bonding, direct lead bonding, and the like, which are mainly formed in the electrode portion 11 of the wide gap semiconductor element forming portion 1. Accordingly, this configuration allows a photodiode output current Ip to be measured with accuracy and high sensitivity at the side of the photodiode 3.

In addition, if the emitted light from the wide gap semiconductor element is guided to the optical fiber 20 after being focused, accuracy of the measurement can be further improved.

Then, finally, in a state shown in FIG. 1, the wide gap semiconductor element forming portion 1, the optical fiber 20, and the photodiode 3 are sealed and packaged with a gel material having light transmittance, to complete the semiconductor device according to the first preferred embodiment.

FIG. 3 is a graph showing relationships between an operating current Iw flowing through the IGBT main body 101 as the wide gap semiconductor element and the photodiode output current Ip in the photodiode 3. In FIG. 3, a temperature-relationship line L25 shows the case where the operating temperature of the IGBT main body 101 is 25° C., while a temperature-relationship line L150 shows the case where the operating temperature thereof is 150° C.

As described above, when the semiconductor active portion 12 emits light by the bipolar operation, the emitted light is guided to the photodiode 3 through the optical fiber 20, and thereby, the photodiode output current Ip can be generated from the photodiode 3.

On the other hand, the light emission intensity of the emitted light is proportional to the operating current Iw flowing through the wide gap semiconductor element. The photo-diode output current Ip is proportional to the light emission intensity of the emitted light, and has a wavelength dependence.

For example, when SiC is used as a wide gap semiconductor material, 4H—SiC has a band gap of 3.26 eV (temperature 300K), and a light emitting wavelength is approximately 380 nm.

FIG. 4 is a graph showing relationships between a temperature (K) and band gap energy according to the respective semiconductor materials. In FIG. 4, energy curves L11, L12, and L13 show the band gap energy of Ge, Si, and GaAs, respectively.

As shown in FIG. 4, the band gap of the semiconductor material has a temperature dependence, and when the band gap at 0(K) is represented by Eg(0), the band gap energy at T(K) can be expressed by the following equation (1). Specifically, the band gap energy Eg(T) is reduced due to the temperature rise (rise of T).

$$Eg(T)=Eg(0)-\alpha T^2/(T+\beta) \quad (1)$$

The following Table 1 shows values of Eg(0), $\alpha$, and $\beta$ of the equation (1).

TABLE 1

| MATERIAL | Eg (0) | α (×10⁻⁴) | β |
| --- | --- | --- | --- |
| GaAs | 1.519 | 5.405 | 204 |
| Si | 1.170 | 4.75 | 636 |
| Ge | 0.7437 | 4.774 | 235 |

As is apparent from the equation (1), when the temperature rises during operation of the wide gap semiconductor element of the IGBT main body 101 and the like, the band gap energy is reduced and the light emitting wavelength becomes long.

Figure 5:
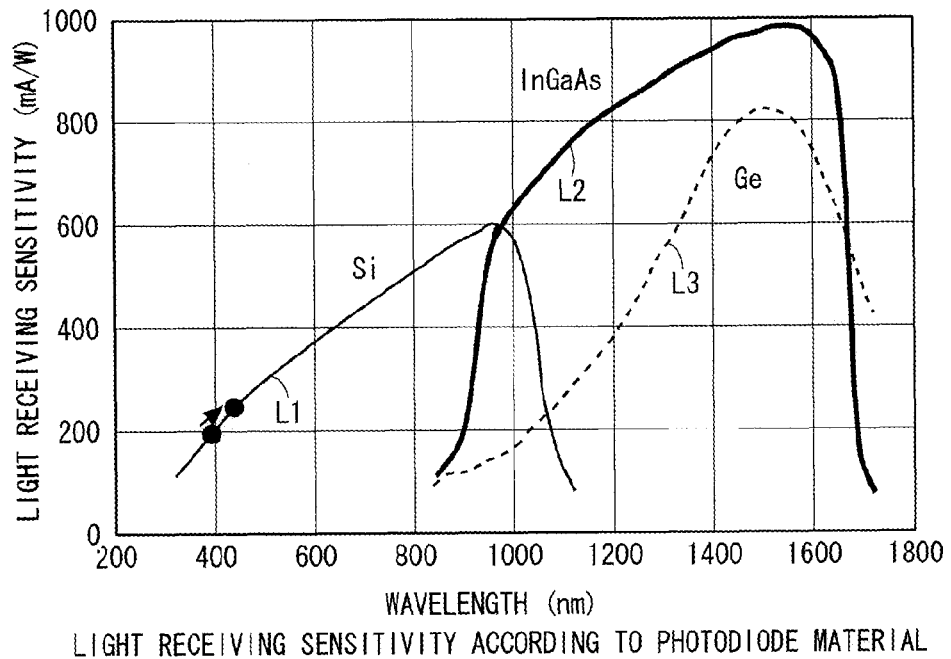
FIG. 5 is a graph showing relationships between a wavelength of light to be received and light receiving sensitivity of a photodiode.

FIG. 5 is a graph showing relationships between a wavelength of light to be received and light receiving sensitivity of the photodiode 3. In FIG. 5, light receiving sensitivity curves L1, L2, and L3 show the relationships therebetween in cases of using Si, InGaAs, and Ge, respectively.

As shown in the light receiving sensitivity curve L1 of FIG. 5, when a photodiode made of Si is used as the photodiode 3, a longer wavelength has higher light receiving sensitivity at a wavelength around 400 nm. Therefore, even in a case where the light emission intensity is the same (operating current Iw flowing through the wide gap semiconductor element is the same), the light emitting wavelength is longer as the temperature of the wide gap semiconductor element is higher, and the photodiode output current Ip becomes greater.

That is, the photodiode output current Ip is determined by the light emission intensity of the emitted light from the semiconductor active portion 12 and the operating current Iw flowing during operation of the wide gap semiconductor element. In addition, the light emission intensity has a dependence on the wavelength of the emitted light, and the wavelength thereof has a dependence on the temperature of the semiconductor element during operation.

By using the characteristics described above, the operating current Iw flowing through the wide gap semiconductor element is monitored by the current sensing portion such as the current sensing IGBT 102 shown in FIG. 2, and the photodiode output current Ip is measured, so that the temperature of the wide gap semiconductor element can be detected.

That is, since the photodiode output current Ip is determined by the operating temperature and the operating current Iw of the wide gap semiconductor element, the temperature of the wide gap semiconductor element during operation can be obtained from the photodiode output current Ip and the operating current Iw.

While, for example, SiC, GaN, and the like are considered as the wide gap semiconductor material, a Schottky barrier diode employing JBS (Junction Barrier Schottky) structure, a PN (junction) diode, an IGBT (Insulated Gate Bipolar Transistor), a bipolar transistor, and the like are considered as the wide gap semiconductor element. In the semiconductor device according to the first preferred embodiment, the operating temperature of the wide gap semiconductor element can be measured for each of the different wide gap semiconductor materials, or for each of the different types of the wide gap semiconductor elements, as described above.

In addition, the photodiode 3 that receives the emitted light obtained by propagation through the optical fiber 20 is provided as a temperature detecting portion. With this configuration, therefore, the photodiode 3 is not required to be provided integrally with the IGBT main body 101 and the like inside the wide gap semiconductor element forming portion 1, so that a formation area of the wide gap semiconductor element forming portion 1 can be reduced to achieve cost reduction.

Further, when the forming area of the wide gap semiconductor element forming portion 1 is formed in the same size as the conventional technique, no formation of a temperature detecting portion is required. With this configuration, a greater effective area of the wide gap semiconductor element can be obtained as compared to the conventional technique, so that properties of the wide gap semiconductor element can be improved.

Further, a temperature detecting portion, such as the photodiode 3 and the like which is electrically weak, is not formed integrally with the IGBT main body 101 and the like inside the wide gap semiconductor element forming portion 1. With this configuration, the reliability of the wide gap semiconductor element forming portion 1 can be improved.

Further, if the emitted light at the time of light emission of the wide gap semiconductor element is guided to the photodiode 3 through the optical fiber 20, the photodiode 3 can be disposed in a position relatively distant from the wide gap semiconductor element.

Accordingly, even if the wide gap semiconductor element has a high operating temperature of 200° C. or higher, adjusting a length of the optical fiber 20 allows a distance between the semiconductor active portion 12 and the photodiode 3 to be set such that the temperature of the photodiode 3 is lowered to an operable temperature (e.g., 150° C. or lower) with the distance therebetween. As a result, even if the wide gap semiconductor element is operated at a high temperature of 200° C. or higher, the photodiode output current Ip can be measured by using the photodiode 3 which operates at 150° C. or lower.

On the other hand, in a conventional semiconductor device, as shown in FIG. 8, a temperature detecting element (temperature sensing portion 54) is disposed inside a wide gap semiconductor chip (substrate 50). With this configuration, when the wide gap semiconductor element is operated at the temperature of 200° C. or higher, the temperature detecting element is inevitably exposed to a temperature environment of 200° C. or higher and it has been impossible to detect temperature.

Thus, the optical fiber 20 is interposed between the wide gap semiconductor element and the photodiode 3. With this configuration, the temperature in the vicinity of the photodiode 3 can be lowered than the temperature in the vicinity of the wide gap semiconductor element, so that even when the wide gap semiconductor element is in a state of a high temperature of 200° C. or higher, the operating temperature thereof can be detected by the photodiode output current Ip which is detectable by the photodiode 3.

<Second Preferred Embodiment>

Figure 6:
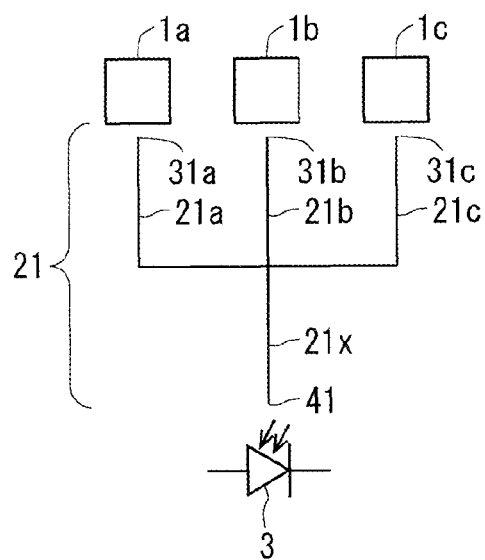
FIG. 6 is an explanatory view schematically showing a planar configuration of a semiconductor device according to a second preferred embodiment of the present invention.

FIG. 6 is an explanatory view schematically showing a planar configuration of a semiconductor device according to a second preferred embodiment of the present invention. As shown in FIG. 6, there are formed a plurality of wide gap semiconductor element forming portions 1a to 1c each of which has an IGBT main body 101, a current sensing IGBT 102, and the like, as shown in FIG. 2. The wide gap semiconductor element forming portions 1a to 1c radiate a plurality (three) of pieces of emitted light from side surfaces of respective semiconductor active portions 12 of the wide gap semiconductor element forming portions 1a to 1c, as shown in FIG. 1, with light emission by the bipolar operation by the respective IGBT main bodies 101 and the like.

Here, an optical fiber 21 according to the second preferred embodiment is configured by branching parts 21a to 21c having three branches, and an integrated part 21x connected in common to the branching parts 21a to 21c, and is configured such that pieces of light incident from incident surfaces 31a to 31c of the branching parts 21a to 21c (pieces of emitted light from the wide gap semiconductor element forming portions 1a to 1c) are outputted in common from an emitting surface 41 of the integrated part 21x to the photodiode 3. Specifically, the branching parts 21a to 21c and the wide gap semiconductor element forming portions 1a to 1c respectively correspond to each other, and the incident surfaces 31a to 31c of the branching parts 21a to 21c are provided such that emitted light at the time of light emission of a corresponding wide gap semiconductor element forming portion out of the respective wide gap semiconductor element forming portions 1a to 1c (during operation of the IGBT main body 101) is incident. On the other hand, the emitting surface 41 of the integrated part 21x is provided such that the emitted light through the optical fiber 21 (branching parts 21a to 21c and the integrated part 21x) is received by the photodiode 3.

Thus, the semiconductor device according to the second preferred embodiment can detect temperature during operation of the three wide gap semiconductor element forming portions 1a to 1c by using the single photodiode 3, can suppress cost increase, and can achieve size reduction of the entire semiconductor device in which the wide gap semiconductor element forming portions 1a to 1c, the optical fiber 21, and the photodiode 3 are sealed with a gel material to be modularized, in the same manner as in the first preferred embodiment. As will be described below, a temperature abnormality detection process can be executed in which a temperature abnormality of any one of the wide gap semiconductor element forming portions 1a to 1c is detected during the operation thereof. Specifically, detection can be made that the temperature during operation of the wide gap semiconductor element forming portions 1a to 1c is a certain temperature or higher, and the temperature abnormality detection process as described below can be executed for protection.

The photodiode output current Ip by the photodiode 3 when all of the wide gap semiconductor element forming portions 1a to 1c are operated at a room temperature can be preliminarily obtained from a total value of the operating currents Iw flowing respectively through the wide gap semiconductor element forming portions 1a to 1c.

Here, $\Delta I1$, $\Delta I2$, and $\Delta I3$ represent increments of the photodiode output current Ip increased as temperatures of the respective wide gap semiconductor element forming portions 1a to 1c rise from the room temperature. For example, when it is desired to determine, as an abnormality, a case in which at least one of the plurality of wide gap semiconductor elements (IGBT main body 101) has a temperature of 200° C. or higher, for example, it can be set to determine, as an abnormality, a case in which an increased current summation $\Delta Iall$ ($\Delta I1+\Delta I2+\Delta I3$) of the photodiode output current Ip becomes equal to or greater than a predetermined upper limit threshold $\Delta \alpha$, on the understanding that while only $\Delta I1$ is increased due to a temperature rise, all of others remain the same values showing operation at the room temperature.

In the semiconductor device according to the second preferred embodiment, however, when temperatures of two or more of the wide gap semiconductor elements out of the wide gap semiconductor element forming portions 1a to 1c rise simultaneously, there may be a possibility that the increased current summation $\Delta Iall$ exceeds $\Delta \alpha$ even if the temperatures of the two or more wide gap semiconductor elements do not reach 200° C. or higher. Accordingly, this configuration has a problem associated with excessive detection.

Thus, in the semiconductor device according to the second preferred embodiment, the plurality (three) of wide gap semiconductor elements in the wide gap semiconductor element forming portions 1a to 1c are put in an operating state to output a plurality of pieces of emitted light, and then, all of the plurality of pieces of emitted light emitted from the emitting surface 41 of the integrated part 21x is received by the single photodiode 3, so that the single photodiode 3 can be used to detect a high temperature abnormal state of any one of the plurality of wide gap semiconductor elements.

Further, the semiconductor device according to the second preferred embodiment is configured that the single photodiode 3 is provided for the plurality of wide gap semiconductor element forming portions 1a to 1c. With this configuration, the number of elements can be reduced to suppress cost increase, and the size of the entire semiconductor device can be reduced.

<Third Preferred Embodiment>

Figure 7:
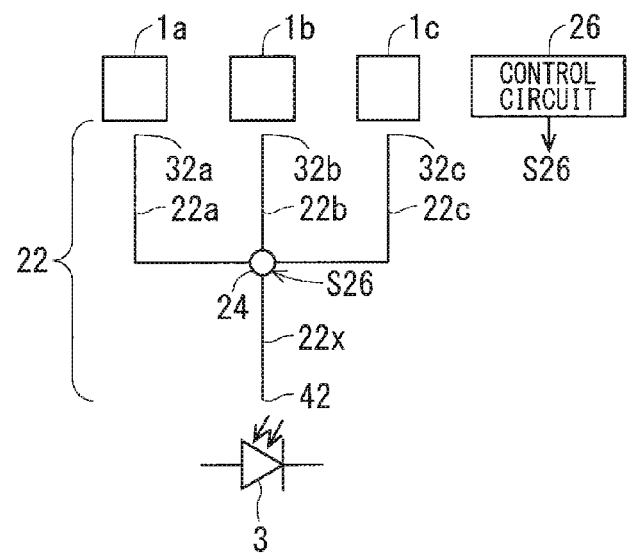
FIG. 7 is an explanatory view schematically showing a planar configuration of a semiconductor device according to a third preferred embodiment of the present invention.

FIG. 7 is an explanatory view schematically showing a planar configuration of a semiconductor device according to a third preferred embodiment of the present invention. As shown in FIG. 7, the semiconductor device includes a plurality (three) of wide gap semiconductor element forming portions 1a to 1c, corresponding to a wide gap semiconductor element forming portion 1 shown in FIG. 1, in the same manner as in the second preferred embodiment. The wide gap semiconductor element forming portions 1a to 1c emit pieces of light from side surfaces of respective semiconductor active portions 12, as shown in FIG. 1.

An optical fiber 22 according to the third preferred embodiment is configured by branching parts 22a to 22c having three branches and an integrated part 22x connected in common to the branching parts 22a to 22c, and is provided with a changeover switch 24 serving as an optical path switch between the branching parts 22a to 22c and the integrated part 22x.

The changeover switch 24 is configured as an optical switch of a machinery type, an electronic type, all-optical type, and the like, and selects any one of the optical paths from the branching parts 22a to 22c based on a control signal S26 of a control circuit 26, to perform an optical path changeover operation which connects between a selected optical path and the integrated part 22x so as to be capable of propagating light.

In the same manner as the optical fiber 21 of the second preferred embodiment, the branching parts 22a to 22c of the optical fiber 22 and the wide gap semiconductor element forming portions 1a to 1c respectively correspond to each other, and incident surfaces 32a to 32c of the branching parts 22a to 22c of the optical fiber 22 are provided such that emitted light at the time of light emission of a corresponding wide gap semiconductor element forming portion out of the respective wide gap semiconductor element forming portions 1a to 1c is incident. On the other hand, an emitting surface 42 of the integrated part 22x is provided such that the emitted light through the optical fiber 22 (the selected optical path and the integrated part 22x) is received by the photodiode 3.

In this state, by the optical path changeover operation of the changeover switch 24, the emitted light incident to the selected optical path out of the branching parts 22a to 22c is propagated through the integrated part 22x to be outputted from the emitting surface 42 to the photodiode 3.

Thus, the semiconductor device according to the third preferred embodiment is configured so as to be capable of selectively detecting a temperature at a single wide gap semiconductor element forming portion at the time of light emission (during operation) of the three wide gap semiconductor element forming portions 1a to 1c by using the single photodiode 3. Accordingly, cost increase can be suppressed, and the size of the entire semiconductor device in which the wide gap semiconductor element forming portions 1a to 1c, the optical fiber 22, and the photodiode 3 are sealed with a gel material to be modularized can be reduced, in the same manner as in the second preferred embodiment.

Hereinafter, a description will be made of a selective temperature detection process in which temperature measurement during operation of the wide gap semiconductor element forming portions 1a to 1c is selectively performed, in the semiconductor device according to the third embodiment.

For example, when the temperature measurement of the wide gap semiconductor element forming portion 1b is performed, by the optical path changeover operation of the changeover switch 24 based on the control signal S26, the branching part 22b is selected as the selected optical path to activate only optical propagation of the branching part 22b and the integrated part 22x.

Subsequently, in the same manner as the semiconductor device of the first preferred embodiment, an operating temperature of the wide gap semiconductor element forming portion 1b can be obtained from the operating current Iw of the wide gap semiconductor element forming portion 1b and the photodiode output current Ip during operation of the wide gap semiconductor element forming portion 1b.

Accordingly, in the semiconductor device according to the third preferred embodiment, only one branching part out of the branching parts 22a to 22c can be selectively activated as a selected optical path by the optical path changeover operation of the changeover switch 24, so that even when the wide gap semiconductor element forming portions 1a to 1c are operated simultaneously, there occurs no problem of excessive detection, which has been a disadvantage of the second preferred embodiment.

Thus, in the semiconductor device according to the third preferred embodiment, the selected optical path out of the branching parts 22a to 22c is switched by the changeover switch 24 serving as the optical path switch. With this configuration, detection of respective operating temperatures of the plurality (three) of wide gap semiconductor elements can be selectively performed by the single photodiode 3.

<Additional Features>

A control circuit 26 shown in FIG. 7 can be operated, for example, by a programming process using a CPU based on a software program.

In addition, operating temperature calculating means for obtaining an operating temperature of a wide gap semiconductor element by an operating current Iw and a photodiode output current Ip can be implemented, for example, by a programming process using a CPU based on a software program.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor element that is formed of a wide gap semiconductor material having light-emitting property, and that emits light during operation;
   a current detecting portion that detects a current flowing during the operation of said semiconductor element as an operating current;
   an optical fiber on which emitted light during the operation of said semiconductor element is incident; and
   a photodiode that receives said emitted light obtained by propagation through said optical fiber, wherein
   said current detecting portion is electrically and optically independent from said optical fiber and said photodiode.

2. The semiconductor device according to claim 1, wherein
   said semiconductor element and said current detecting portion are integrally formed as a semiconductor element forming portion integrated into one chip,
   said emitted light of said semiconductor element is emitted from a side surface portion of said semiconductor element forming portion, and
   an incident surface of said optical fiber is arranged so as to be opposed to said side surface portion of said semiconductor element forming portion.

3. The semiconductor device according to claim 2, wherein:
   said semiconductor element forming portion includes a plurality of said semiconductor element forming portions each of which having said semiconductor element and said current detecting portion,
   said optical fiber includes a plurality of branching parts having incident surfaces, respectively, and an integrated part having an emitting surface, the integrated part being connected in common to said plurality of branching parts,
   the respective incident surfaces of said plurality of branching parts are provided such that emitted light at the time of light emission of a corresponding semiconductor element forming portion out of said plurality of semiconductor element forming portions is incident, and
   said emitting surface of said integrated part is provided such that said emitted light is received by said photodiode.

4. The semiconductor device according to claim 3, further comprising
   an optical path switch which is provided between said plurality of branching parts and said integrated part, and activates an optical path formed by said integrated part and a selected optical path as one of said plurality of branching parts.

5. The semiconductor device according to claim 1, wherein
   said wide gap semiconductor material having light-emitting property includes at least one of SiC and GaN, and
   said semiconductor element includes at least one element of a Schottky barrier diode, a PN diode, an IGBT, and a bipolar transistor.

* * * * *